United States Patent
Arndt et al.

(10) Patent No.: US 9,624,571 B2
(45) Date of Patent: Apr. 18, 2017

(54) METHOD FOR MANUFACTURING A METAL-BOROCARBIDE LAYER ON A SUBSTRATE

(71) Applicant: Oerlikon Surface Solutions AG, Trubbach, Trubbach (CH)

(72) Inventors: Mirjam Arndt, Bad Ragaz (CH); Helmut Rudigier, Bad Ragaz (CH); Hamid Bolvardi, Aachen (DE); Jochen Schneider, Aachen (DE)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 14/427,032

(22) PCT Filed: Sep. 9, 2013

(86) PCT No.: PCT/EP2013/002700
§ 371 (c)(1),
(2) Date: Mar. 10, 2015

(87) PCT Pub. No.: WO2014/053209
PCT Pub. Date: Apr. 10, 2014

(65) Prior Publication Data
US 2015/0232982 A1    Aug. 20, 2015

(30) Foreign Application Priority Data

Sep. 10, 2012 (DE) .................. 10 2012 017 809

(51) Int. Cl.
*C23C 14/06* (2006.01)
*C23C 14/35* (2006.01)
*C01B 31/30* (2006.01)

(52) U.S. Cl.
CPC ............ *C23C 14/35* (2013.01); *C01B 31/301* (2013.01); *C23C 14/06* (2013.01)

(58) Field of Classification Search
USPC .......... 204/192.1, 0.15, 0.16, 0.38; 428/698, 428/704
See application file for complete search history.

(56) References Cited

U.S. PATENT DOCUMENTS

| | | | |
|---|---|---|---|
| 2010/0189978 A1* | 7/2010 | Schier | ..................... C23C 4/125 204/192.15 |
| 2011/0045283 A1* | 2/2011 | Holzschuh | .............. C23C 16/56 428/336 |

(Continued)

FOREIGN PATENT DOCUMENTS

DE    10 2010 042 828    *    4/2012
WO    2012/052437 A1    4/2012

OTHER PUBLICATIONS

Hasehase, et al. "Preparation of C-Axis Fibre Textured Thin Films by Pulsed Laser Deposition: Film Structure and Superconducting Properties", IEEE Transactions on Applied Superconductivity, IEEE Service Center, Los Alamitos, CA, US, Bd. 11, Nr. 1, 1 Mar. 2001, Seiten 3836-3839.

(Continued)

*Primary Examiner* — Archene Turner
(74) *Attorney, Agent, or Firm* — Pearne & Gordon LLP

(57) ABSTRACT

The invention relates to a PVD process for coating a substrate with a layer containing at least one microcrystalline metallic borocarbide phase. During the PVD process, the source output is pulsed such that the at least one peak of which the half intensity width allows conclusions to be drawn about the presence of a microcrystalline phase of the metallic borocarbide layer can be identified in the x-ray spectrum of a layer produced in this way at a substrate temperature below 600° C.

9 Claims, 4 Drawing Sheets

(56) References Cited

U.S. PATENT DOCUMENTS

2011/0311805 A1* 12/2011 Schier ............... C23C 14/081
  204/192.16
2014/0147221 A1* 5/2014 Schier ............... C23C 14/08
  204/192.38

OTHER PUBLICATIONS

Emmerlich, et al., "A Proposal for an Unusually stiff and Moderately Ductile Hard Coating Material: Mo2BC", Journal of Physics D: Applied Physics, Institute of Physics Publishing Ltd., GB, Bd. 42, Nr. 18, Sep. 21, 2009, Seite 185406.

Lui, et al. "The Effect of Deposition Temperature and Work Pressure on Tia Ba C Nanocomposite Coating Prepared by Multitarget Magnetron Cosputtering", IEEE Transactions on Plasma Science, IEEE Service Center, Piscataway, NJ, US, Bd. 39, Nr. 11, 1 Nov. 2011, Seiten 3115-3119.

Lin, et al., "Processing, Structure, and Properties of Nanostructured Multifunctional Tribological Coatings", Journal of Nanoscience and Nanotechnology, Bd. 9, Nr. 7, Jul. 1, 2009, Seiten 4073-4084.

Lin, et al. "Structure and Properties of Ti-B-C-N Nanocomposite Coatings Synthesized Using Pulsed Closed Field Unbalanced Magnetron Sputtering (P-CFUBMS)", Surface and Coatings Technology, Elsevier, Amsterdam, NL, Bd. 203, Nr. 5-7, Dec. 25, 2008, Seiten 588-593.

Arisawa, et al., "Synthesis of YNI2B2C Thin Films by Magnetron Sputtering", Applied Physics Letters, American Institute of Physics, US., Bd. 65, Nr. 10, Sep. 5, 1994, Seiten 1299-1301.

Reibold, et al., "Epitaxial Growth of YNi2B2C Films on Single Crystal MgO Substrates: an HRTEM Investigation of the Interface", Journal of Alloys and Compounds, Elsevier Sequoia, Lausanne, CH, Bd. 347, Nr. 1-2, Dec. 16, 2002, Seiten 24-30.

\* cited by examiner

METHOD FOR MANUFACTURING A METAL-BOROCARBIDE LAYER ON A SUBSTRATE

BACKGROUND OF THE INVENTION

The present invention is directed on deposition of a metalborocarbide-layer on a substrate by means of a pulsed PVD-method. Thereby, it addresses preferably a pulsed cathode sputtering method, whereby the material sputtered off from the cathode is deposited out of the gaseous phase on the substrate as coating material.

Metalborocarbide-materials are applied as base material due to their outstanding mechanical and chemical properties. To do so, different manufacturing methods are known, which are not addressed in details in the following. Nevertheless, these materials are expensive with respect to manufacturing and are problematic with respect to working.

One possible approach is the improvement of components, the base body thereof being of customarily materials as for example of Cermet, Steel, Hardmetal or High-Speed-Steel. Such an improvement may thereby also include a coating with a metalborocarbide-layer. Thereby, one may revert on PVD-method. PVD means in the present context physical vapor deposition and addresses deposition out of the gaseous phase. Schier addresses in the application WO2012/052437 the sputtering PVD-method and especially the HIPIMS method. HIPIMS thereby means High Power Impulse Magnetron Sputtering, which is a sputtering method, in which sputtering from the cathode is performed with the help of a magnetron and with a high current density. Schier addresses sputtering as disadvantageous, because the process gas flow as necessitated is considered to be difficult to control. Beside of this difficulties arise with respect to realise the desired crystalline phase for the coating, as Schier describes with respect to the example of the aluminum oxide.

Therefore, there is described in the WO2012/052437 an arc evaporation method for depositing such layers. In this method an arc is sustained, the incidence spot thereof on the so-called target, which provides for the coating material, migrates whereby target material is evaporated. As target material, a target is used which comprises at least two different metals, whereby at least the metal with the lowest melting temperature of the target is present in a ceramic compound. In this way, the generation of droplets, which is often encountered in arc PVD, shall be suppressed. Nevertheless, this does not completely succeed. If one desires to coat in a substantially droplet-free manner, then at arc PVD-methods customarily laborious filter techniques are necessary, which do significantly reduce the coating rate and make such a technique often un-economical.

Borocarbides of the rear earths are today known as interesting supra conductive materials. In their article "Borocarbide "Thin Films and Tunneling Measurement" which was published in the year 2000 in the frame of NATO workshops in Dresden, Iavarone et al. describe magnetron-sputtering as a method for manufacturing Re—$Ni_2B_2C$, whereby Re stands for an element out of the group which is formed by Y,Er,Lu. The sputtering method was applied at approximately 800° C. and diamante-substrates had to be used.

Therefore, it would be desirable to have a method available, which allows to deposit at moderate temperatures and economically layers of a metalborocarbide upon substrates, whereby such layers should contain, at least to a significant part, desired preferably micro- and/or nano-crystalline phases.

Therefore, it is the object of the present invention to provide such a method.

SUMMARY OF THE INVENTION

According to the present invention the addressed object is resolved in that a pulsed PVD-method is applied. In context with the arc PVD-method, pulsating increases process stability and reduces the formation of droplets significantly. In context with sputtering, the degree of ionization is significantly increased compared with customary sputtering. The inventors have recognized that by pulsing astonishingly micro-crystalline phases of metalborocarbides may be formed already at substrate temperatures below 600° C. This is, up to a certain degree, already the case at a pulsed sputter power which leads to moderate current densities smaller or equal to 100 W/cm², if a target is applied in which the metal is present in a ceramic compound.

Nevertheless, preferably a so called HIPIMS technique is applied, at which current densities at the target surface are applied, which are larger than 100 W/cm². Such current densities are as well applied as pulse so as not to heat up the target excessively. By means of the HIPIMS method and as recognized by the inventors, crystalline phases of metal-borocarbides may be realized also from targets in which the metal is present not in the form of a ceramic compound. Preferably and also when HIPIMS methods are applied, one sputters from a target, in which the metal is present in a ceramic compound and especially as metal-borocarbide.

According to and especially preferred embodiment of the present invention, a negative bias is applied to the substrates during the HIPIMS operation. This bias is between −30V and −400V, whereby the absolute value upper limit besides of other considerations, is determined by the fact that the temperature of the substrates surface as the bias value increases, which is due to the accelerated ions and which leads to an increasing energy impute.

Due to the formation of the micro-crystalline phases already below 600° C. the method according to the invention may be applied in an economic industrial manner because no additional technical measures have to be foreseen to realize the coating plant so as to sustain high temperatures (>600° C.). Especially the addressed method may be applied specially advantageously in the frame of coating substrates which themselves are not to be exposed to high temperatures. A well-known example is HSS Steel.

Within the group of metalborocarbide materials those are of special interest, which are formed with the semi-metals (metalloids). For supra-conductive materials, those metalborocarbides are interesting in which at least one element of the rear earths is present. For improvement appliances, which shall provide wear protection and/or shall lead to surfaces with low friction values, the borocarbides of the transition metals and especially of the elements out of the group formed by Ti, Zr, Hf, V, Nb, Ta, Cr, Mo and W have shown up as especially suited. Preferably, Mo, Zr and/or Cr are used. Such improving treatments may especially and advantageously be applied for tools and components out of the automotive technologies with gliding surfaces.

The invention shall now be exemplified and explained in detail with the help of the figures and with respect of $Mo_2BC$.

DETAILED DESCRIPTION OF THE INVENTION

At first and for comparison purposes $Mo_2BC$ was deposited in a small coating chamber and by means of DC sputtering. The respective coating parameters are:

| | |
|---|---|
| Generator | DC |
| Power | 50 W |
| Target | 50 mm compound target |
| Substrate temperature | 300-700° C. |
| Basic pressure | $\times 10_{-5}$ mbar |

Considered are the substrate temperature effect, roughness and hardness as well as the module of elasticity.

Figure 1:
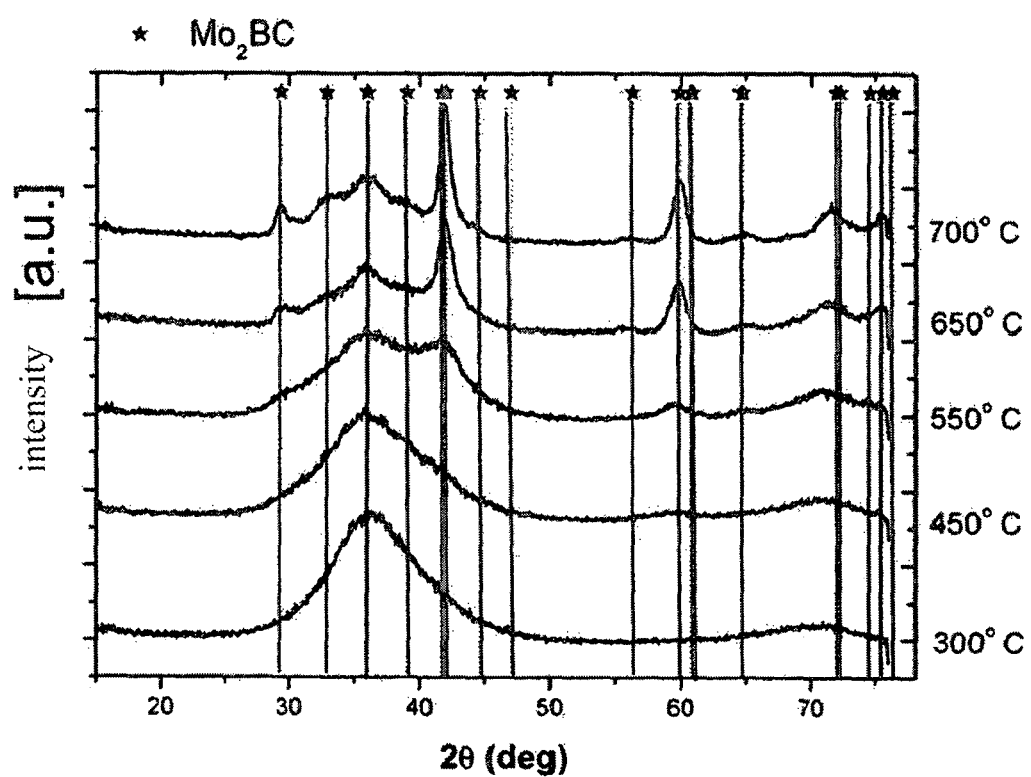
FIG. 1 shows x-ray diffraction spectra of surfaces coated at different substrate temperatures.

The coatings were applied at different temperatures. FIG. 1 respectively shows x-ray diffraction spectra (2 theta) of surfaces coated at substrate temperatures of 300° C., 450° C., 550° C., 650° C. and 700° C. It becomes apparent that only above 600° C. one may consider crystalline phases being present. Below 550° C. Ts amorphous or nano-crystalline phases are present. The modulus of elasticity as well as hardness increase as the substrate temperature decreases.

Figure 2:
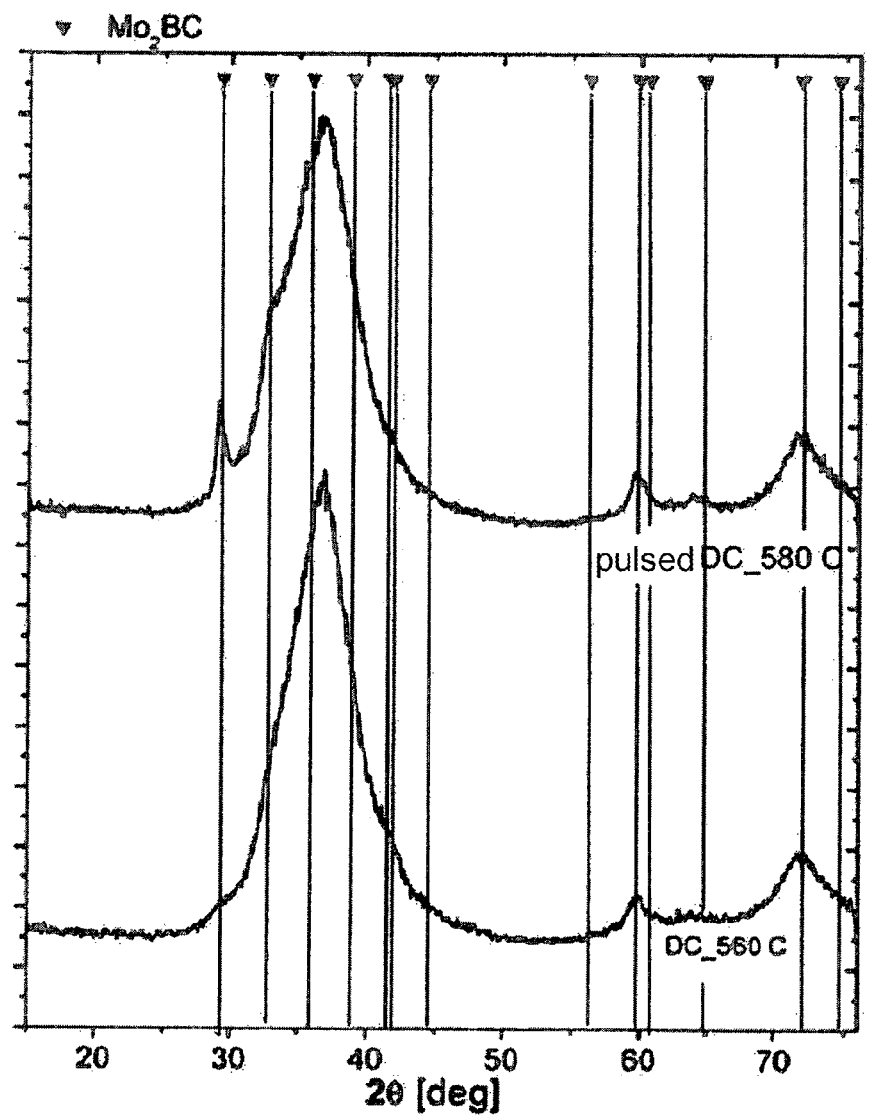
FIG. 2 shows x-ray diffraction spectra of surfaces coated using pulsed power.

In opposition thereto and when applying the deposition by means of a pulsed power, already at 580° C. significant peaks were measured as shows the comparison in FIG. 2. Thereby, the applied method was pulsed magnetron sputtering. The increased plasma density when pulsing the increased ion bombardment and the increased mobility of the adatomes leads to an increased degree of phase formation.

Figure 3:
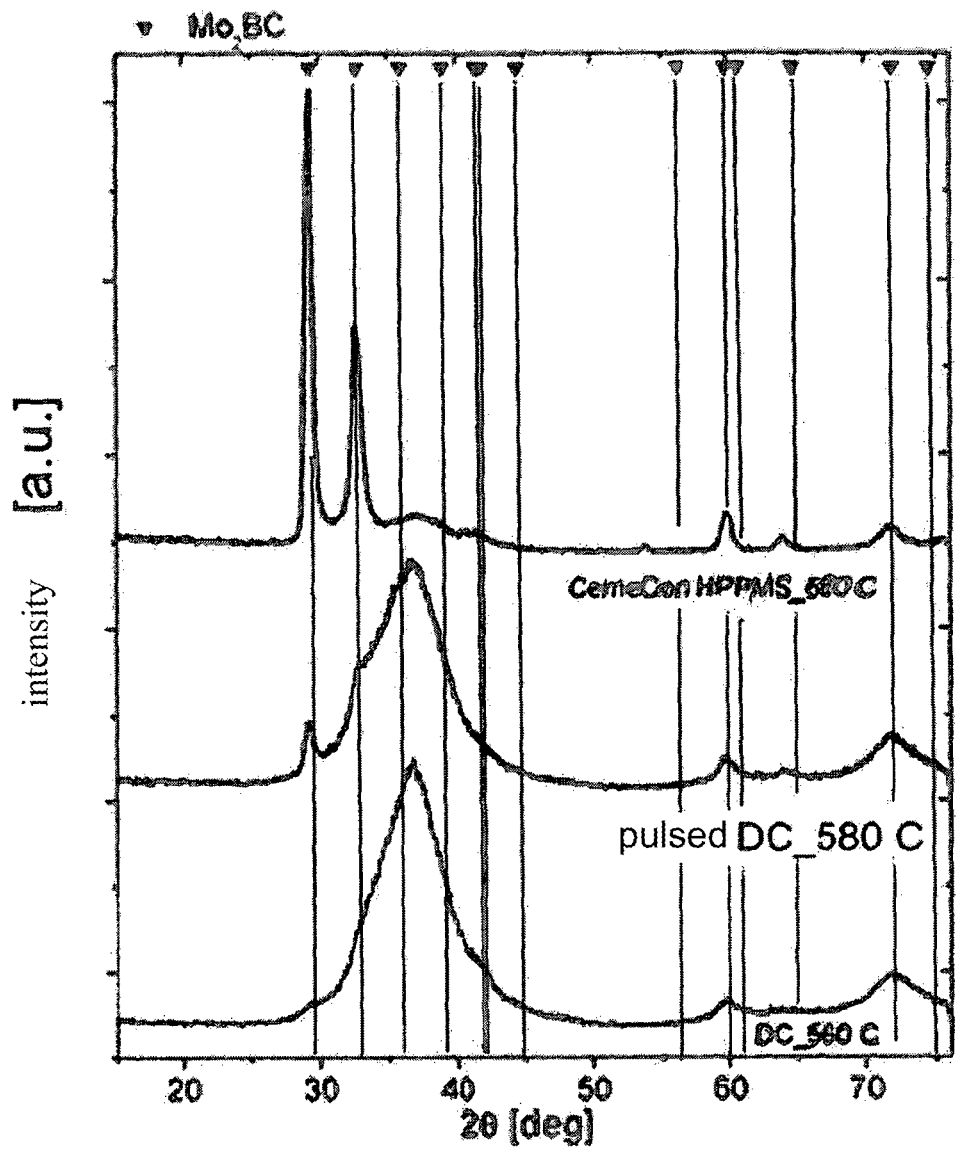
FIG. 3 shows x-ray diffraction spectra of surfaces coated using different methods.
Figure 4:
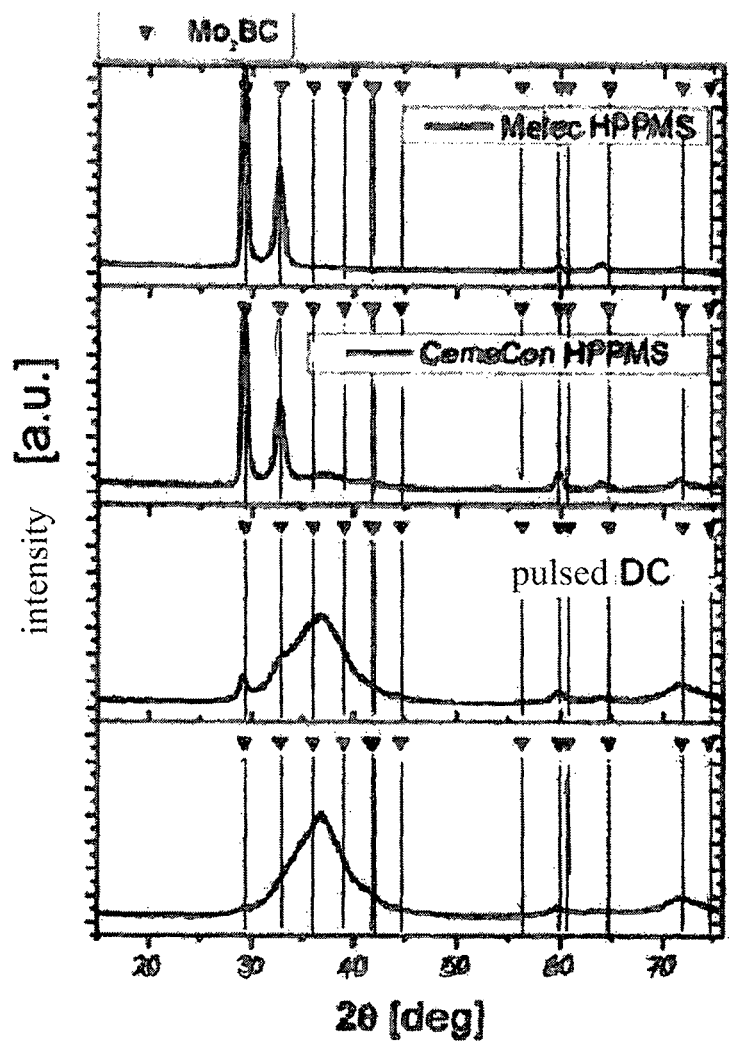
FIG. 4 shows x-ray diffraction spectra of surfaces coated using different methods.

Predominant is the crystalline phase already at a substrate temperature of 580° C. if HIPIMS is applied as clearly shown by FIG. 3. In the present context HPPMS and HIPIMS address the same technique. This leads to the highest degree of crystallization and to a texturized structure. In FIG. 4 the x-ray spectra of different approaches at similar substrate temperatures (560° C. to 580° C.) are shown. The HIPIMS coatings were realized with the help of two different commercially available sources. The same temperature behavior comes up when coating steel substrates. Thus, the selection of the substrate has no influence in this case.

Below 600° C. substrate temperature applying a substrate bias of −100V has no significant effect upon the phase formation at un-pulsed DC-sputtering. In opposition therefore, crystalline phases of $Mo_2BC$ come up at least already at 480° C. substrate temperature, if a HIPIMS technique is applied and simultaneously a negative bias of e.g. −100V is applied to the substrate.

A PVD-method of coating of a substrate with a layer at least containing a microcrystalline metalborocarbide phase was disclosed, whereby the method is characterized by pulsating the source power in the frame of the PVD process so that in the x-ray spectrum of a layer so deposited at a substrate temperature below 600° C., at least one peak may be identified with a half-value width which allows to conclude that a microcrystalline phase of the metalborocarbide is present.

The method may be a pulsed arc PVD-method but is preferably a pulsed sputtering method.

The sputtering method according to the invention may at least to a part be operated with a current density larger than 100 W/cm² as a HIPIMS method.

The PVD method according to the invention may be operated with a target, in which a metal is present in form of a ceramic compound, as an example as a metalborocarbide.

The method according to the invention, the metal-borocarbide may be a material according to the formula $Me_2BC$ whereby Me is an element out of the group formed by Cr, Zr and Mo.

The method may be realized so that the at least one peak has an amplitude with at least double extent with respect to the largest amplitude of a measuring value which suggests a nano-crystalline and/or amorphous phase in a 2Theta x-ray spectrum from 20° to 70°. This may e.g. be achieved by a respectively selected substrate bias at a HIPIMS method as show the figures.

By means of the new method, a with a metal-borocarbide coating may be manufactured at which within the x-ray spectrum of the coating at least one peak may be identified, the half value width thereof being indicative for the presence of a microcrystalline phase of the metalborocarbide.

The metalborocarbide may be a material according to the formula $Me_2BC$ whereby Me is an element out of the group formed by Cr, Zr and Mo.

What is claimed is:

1. A PVD method for coating a substrate with a coating which at least contains a microcrystalline metal-borocarbide phase, characterized by the facts, that in the frame of the PVD method, the source power is pulsed so that in the x-ray spectrum of thereby deposited layer at a substrate temperature below 600° C. at least one peak may be identified, the half value width thereof allowing the conclusion that a microcrystalline phase of the metal-borocarbide is present, wherein the PVD method comprises a HIPIMS method.

2. The method of claim 1, characterized by the fact that the sputtering method is operated at least to a part with a current density larger than 100 W/cm² as the HIPIMS method.

3. The method according to claim 1, characterized by the fact that the PVD method is operated with a target, in which a metal is present as a ceramic compound.

4. The method according to claim 3, characterized by the fact that the ceramic compound is a metal-borocarbide.

5. The method according to claim 1, characterized by the fact that at least during a part of the PVD method, a negative bias is applied to the substrate to be coated.

6. The method according to claim 1, characterized by the fact that the metal-borocarbide is a material according to the formula $Me_2BC$ whereby Me is an element out of the group formed by Cr, Zr and Mo.

7. The method according to claim 1, characterized by the fact that the method is operated so that the at least one peak has an amplitude which is at least twice the largest amplitude of a measuring value, which indicates presence of a nano-crystalline and/or amorphous-phase in a 2Theta x-ray spectrum from 20° to 70°.

8. A workpiece with a metal-borocarbide coating and coated by a method according to claim 1, characterized by the fact that in the x-ray spectrum of the coating at least one peak may be identified the half-value width thereof being indicative for the presence of a micro-crystalline phase of the metal-borocarbide.

9. A workpiece according to claim 8, characterized by the fact the metal-borocarbide is a material according to the formula $Me_2BC$, whereby Me is an element out of the group formed by Cr, Zr and Mo.

* * * * *